United States Patent [19]
Creedon et al.

[11] Patent Number: 4,990,492
[45] Date of Patent: Feb. 5, 1991

[54] STRESS CONTROLLING SUPERCONDUCTOR WIRE

[75] Inventors: Richard L. Creedon, San Diego; Yen-Hwa L. Hsu, Solana Beach, both of Calif.

[73] Assignee: General Atomics, San Diego, Calif.

[21] Appl. No.: 293,227

[22] Filed: Jan. 3, 1989

[51] Int. Cl.$^5$ .............................................. B32B 9/00
[52] U.S. Cl. ........................................ 505/1; 505/701; 505/702; 505/703; 505/704; 29/599; 174/35 MS; 428/457; 428/688; 428/698; 428/930
[58] Field of Search ........................... 505/1, 701–704; 29/599; 174/68.5, 35 MS; 428/457, 688, 698, 930

[56] References Cited

U.S. PATENT DOCUMENTS

| 2,484,214 | 10/1949 | Ford et al. | 154/80 |
| 2,655,717 | 10/1953 | Dunn | 29/155.58 |
| 4,407,062 | 10/1983 | Sutcliffe et al. | 29/599 |
| 4,512,824 | 4/1985 | Taub | 148/121 |
| 4,826,808 | 5/1989 | Yurek et al. | 505/1 |

*Primary Examiner*—Patrick Ryan
*Attorney, Agent, or Firm*—Nydegger & Harshman

[57] ABSTRACT

A method for manufacturing a stress controlled wire comprises the step of twisting superconductor fibers together into a bundle of fibers. A plurality of bundles are then twisted together and disposed within the lumen of a tube and the lumen is flooded with solder which is allowed to harden. The tube and its contents are subsequently heated as they are wound upon a drum to melt the solder and allow realignment of the superconductor fibers within the solder. The subsequent solidification of solder after the tube is wound onto the drum provides an unstressed support for the fiber bundles.

3 Claims, 2 Drawing Sheets

STRESS CONTROLLING SUPERCONDUCTOR WIRE

FIELD OF THE INVENTION

This invention relates generally to a superconductor wire. More particularly, the invention pertains to a method of manufacturing a superconductor wire capable of controlling the stress exerted on an internal ceramic superconductor filament. This invention is particularly, but not exclusively, useful for manufacturing a winding for a magnet.

DISCUSSION OF THE PRIOR ART

It is generally recognized that superconducting materials offer a great deal of potential in the electrical industry In a transmission line or a motor, superconducting material is capable of transferring large amounts of current without generating excessive heat losses because of the extremely low resistance of the superconducting material. Obviously, this highly efficient method of transferring electricity will result in great economic and social benefits in the future. It has been suggested that superconducting material may allow motors to be produced which are one-tenth (1/10) of the normal size. Additionally, it has been speculated that new superconductive data transmission lines could be constructed to carry one trillion bits of information per second, which is approximately 100 times faster than the fiber optic cables which carry many data transmissions and telephone calls at the present time. Further, and of particular importance to the present invention is the potential for the use of superconductor wires in magnet windings.

In the past, one of the primary limitations on the development of superconductors has been the fact that most materials are superconductive only at extremely low temperatures. More recently, however, it has been found that certain specialized ceramics exhibit superconductive properties at temperatures above those of traditional superconducting materials. Appropriately, these specialized ceramics or other suitable fibers are often referred to in the art as "high temperature superconducting materials." These ceramic superconductors exhibit superconductivity characteristics at the temperature of liquid nitrogen, which is a great improvement over traditional superconductors.

One of the difficulties with ceramic superconductors is their inability to be easily bent or flexed into a desired position, such as into a winding for a motor or magnet. Unfortunately, ceramic superconductor materials lack the ductility of metallic conductors and cannot withstand much tensile stress when bent. Consequently, ceramic superconductors generally exhibit a brittle characteristic which has required special design considerations.

It is known that a ceramic superconductor can be supported on a substrate fiber to enhance the strength of the ceramic and to help overcome the difficulties associated with its brittle characteristic. To help support the ceramic superconductor, a superconductive wire is constructed in which the ceramic filaments are embedded in a matrix of a supporting material which is more ductile, in an attempt to surmount the brittleness problem. The use of a supporting material, however, creates its own problems For example, when the superconductive wire is bent around a drum to form a winding for a magnet, the supporting material may cause additional stress to be placed upon the superconductor filaments. This is due in part to the fact that the stress exerted on the wire during bending or shaping is proportional to one-half the depth or thickness of the filament divided by the radius of the bend. Thus, for a given bend radius, increasing the thickness increases the stress, and since the ceramic filaments are embedded in and are bound to the supporting material, the increased thickness of the wire results in more stress upon the ceramic filaments. It would be an improvement over the prior art if a ceramic superconductor was supported by a surrounding matrix material that did not increase stresses exerted on the ceramic filament when being bent or shaped.

Another problem is encountered when superconductors are used to transmit electrical current. When current passes through a wire, electromagnetic forces are generated within the material which can place significant stresses on the material. These additional forces created by the current are virtually unavoidable and must be taken into consideration when designing magnet coils and transmission lines. Thus, a superconductive wire already having external stresses placed on it by its supporting material has additional stresses placed on it by high current passing through it. This can cause the wire to fracture and hence become ineffective as a conductor. Thus, any reduction in stress exerted on the ceramic superconductor wire would be an improvement over the prior art.

In light of the above, an object of the present invention is to have a superconductive wire which supports the superconducting ceramic filaments and controls the amount of stress placed thereon. A related object of the present invention is to have a bendable superconductive wire which minimizes external stresses on the internal superconducting ceramic filaments while being bent. Further, an object of the present invention is to make a winding for a magnet which does not have external stresses exerted on it by its supporting material. Yet another object of the present invention is to minimize the stress on a superconductive wire when a large current is passed through the wire. Finally, an object of the present invention is to have a superconductive wire which is relatively easy to manufacture and comparatively cost effective for use in the electrical and magnet industry.

SUMMARY OF THE INVENTION

A preferred embodiment of the superconductor wire of the present invention comprises a thin-walled tube wound around a drum to transmit electricity for a magnet. Positioned within the lumen of the tube are superconductor filaments twisted together into one or more bundles for transmitting electricity from a first end to a second end of the tube. For supporting the plurality of superconducting bundles, the lumen of the tube is flooded with a solder which is allowed to harden and surround the bundles. The solder is heated during the winding upon the drum to melt the solder and allow realignment of the superconductor filament bundles within the liquified solder to provide unstressed support for the ceramic material.

In the manufacturing of a winding for a magnet made of the superconducting wire, superconductor filaments are twisted or wound together to form one or more bundles or cables. The cables are aligned within the tube and liquified solder is injected into the tube. The tube is allowed to cool to solidify the solder which supports the cables. When making the winding, the wire is heated to again melt the solder as the wire is wound onto tee drum to create the winding. After the winding has been formed, the solder is once again allowed to solidify in order to provide external support for the superconductor filament cables contained within the supporting material. Liquifying the solder during the bending process allows realignment of the filaments within the solder and minimizes the stress on the superconductor filaments.

The novel features of this invention, as well as the invention itself, both as to its structure and its operation, will be best understood from the accompanying drawings, taken in conjunction with the accompanying description, in which similar reference characters refer to similar parts, and in which:

DESCRIPTION OF THE PREFERRED EMBODIMENT

Figure 1:
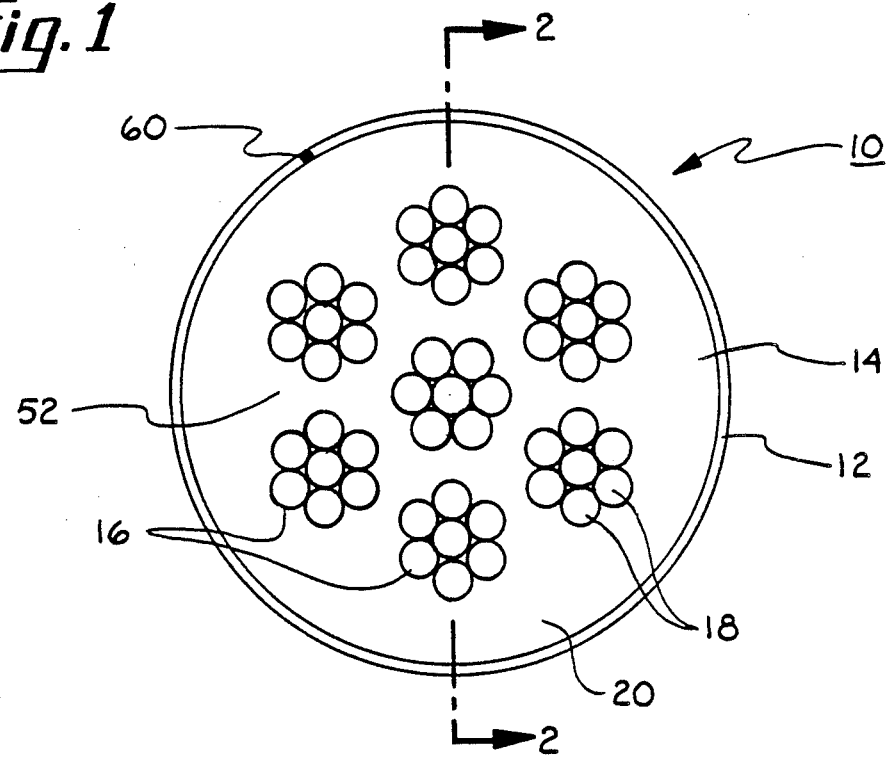
FIG. 1 is a front cross-sectional view of one presently preferred embodiment of the stress controlling superconductor wire of the present invention showing a plurality of superconductor filament bundles surrounded by a filler that is contained inside a tube.

Referring initially to FIG. 1, a front cross-sectional view of the present invention is shown. In FIG. 1, the stress controlling superconductor wire, generally designated 10, is shown having a surrounding tube 12 with a lumen 14. Although a cylindrical tube 12 is shown in FIG. 1, it is to be appreciated that the configuration of tube 12 is not a limitation of the present invention. Indeed, a rectangular cross section for a structure comparable to tube 12 will be as efficacious and, depending on the particular application, may be more appropriate. Positioned in tube 12 are bundles 16 within lumen 14. In the preferred embodiment, each individual bundle 16 comprises a plurality of superconducting ceramic filaments 18 which are twisted or woven into a cable 52. For properly positioning and supporting bundles 16 in place within lumen 14, an electrically and thermally conducting filler 20 is injected into tube 12 to completely surround the plurality of bundles 16.

Figure 2:
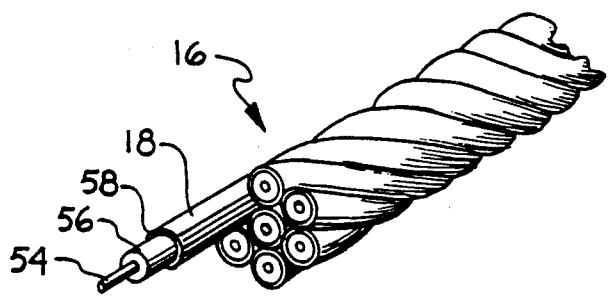
FIG. 2 is a perspective view of a filament bundle with a cross-sectional view thereof.

In FIG. 2, a bundle 16 is shown wherein the ceramic filaments 18 are twisted together. As such each bundle 16 is, by itself, a rope of filaments 18. Several of these ropes or bundles 16 are then subsequently twisted together to form cable 52. Before further discussion of cable 52, however, it should be noted that each element 18 in the bundles 16 can comprise a metal substrate 54 on which superconductor particles have been sintered to form a ceramic coating 56. In order to help protect ceramic coating 56 and add further electrical transmission capacity to filament 18, a silver layer 58 can be used to cover ceramic coating 56.

Figure 3:
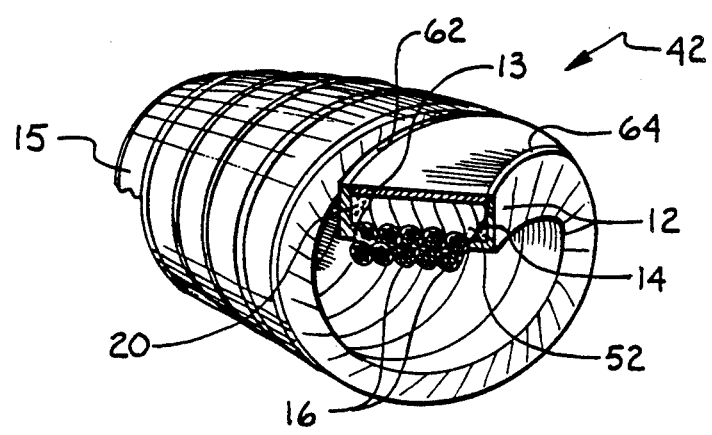
FIG. 3 is a perspective view of a winding of an embodiment of the superconductor wire with a portion shown in cross section.

Referring now to FIG. 3, the orientation of bundles 16 inside a rectangular-shaped tube 12 can be more easily understood. As can be appreciated from this side crosssectional view, each bundle 16 is helically disposed within lumen 14 and extends along the length of tube 12. As shown, tube 12 has a first end 13 and a second end 15. In the preferred embodiment, tube 12 can be made of either copper, copper alloy, aluminum or an aluminum alloy. As can be appreciated, filler 20 suspends bundles 16 in place because filler 20 is a solid material in its normal operating state. Preferably, filler 20 is a solder made of a tin-lead alloy. It is to be understood, however, that other solder materials such as alloys containing lead, tin, bismuth, silver, or indium would also be suitable for the present invention. In any event, it is important that filler 20 be both thermally and electrically conducting.

Still referring to FIGS. 2 and 3, it can be appreciated that each bundle 16 is made up of twisted or woven superconductor filaments 18. In the preferred embodiment, as stated above, each filament 18 comprises a substrate 54 which is coated with a superconductor material 56. Superconductor materials are generally brittle, therefore, filler 20 is contained within tube 12 to provide stabilizing support against magnetic forces for the brittle superconductor filaments 18. Additionally, filler 20 will provide some degree of lubrication when it is melted during the winding of cable 52 and tube 12 into their desired configuration.

For purposes of the present invention, tube 12 provides a protective casing in which the cable 52 is placed. Tube 12 will therefore require some means by which it can be closed around cable 52. Whether this be at joint 60 for tube 12 as shown in FIG. 1 or at the joints 62, 64 for tube 12 shown in FIG. 3, the brazing together at the respective joints can be accomplished with any solder which has a higher melting temperature than the solder used for filler 20.

METHOD OF USE AND METHOD OF MANUFACTURE

As mentioned above, it is to be understood that ceramic superconductor materials are generally brittle and cannot withstand excessive tensile stresses. In order to manufacture a winding for a magnet or a motor, however, these superconductor filaments must be bent around a drum. Unfortunately, when the superconductor material is bent, extensive tensile stresses are exerted on the superconductor material filaments. Therefore, when bending the superconductor material, it is preferable that the tensile stresses be minimized.

Figure 4:
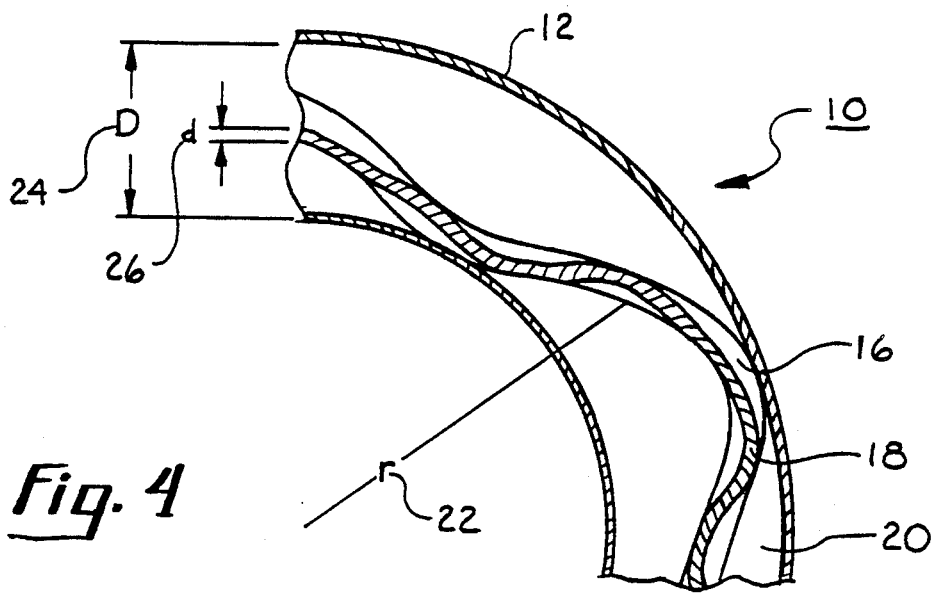
FIG. 4 is a cross-sectional side view of the stress controlling superconductor wire showing only a single bundle within the wire and only a single filament in the bundle.

Referring now to FIG. 4, a bent superconductor wire 10 is illustrated. In FIG. 4, one selected superconductor filament 18 within a single selected bundle 16 is shown contained within tube 12. Filler material 20 is contained around the entire surface of this bundle 16, as well as all of the other bundles 16 not shown in FIG. 4, for providing support when tube 12 is held in a fixed position. Filler material 20 also provides lubrication when the filler 20 is melted during the bending of tube 12.

It is known that when a fiber or wire is bent, the stress exerted at the surface of the wire or fiber is maximal and proportional to one-half the depth of the wire or fiber divided by the radius of the bend. Thus, the stress exerted on tube 12, when it is bent, is proportional to one-half the depth 24 divided by the radius 22. Unfortunately, if tube 12 is bent when filler material 20 is in its solid state, the effective half-depth of filament 18 is the same as for tube 12 (i.e. half of depth 24) and the stress exerted on filament 18 is equivalent to the stress exerted on tube 12. This only aggravates the already existing stresses on filament 18 which result when filaments 18 are twisted into bundle 16. Therefore, when filler 20 is in its solid state, any bending of tube 12 exerts increased stress forces on filament 18. Obvious ways to lessen the tensile stress exerted on filament 18 when it is solidly embedded in filler 20 are to increase the radius of bend 22 of tube 12 or decrease depth 24. Another problem occurs if all bundles 16 are aligned in a parallel relationship. To help overcome this problem, bundles 16 are twisted together in a helical manner as shown in FIGS. 3 and 4. If so aligned, bundles 16 on the outside of the bend will be stretched and the bundles 16 on the inside of the bend will be compressed.

It has been found that in order to lessen these external forces exerted on filaments 18 in bundle 16, filler 20 can be liquified when tube 12 is being bent. The resultant forces exerted on filament 18 are then only the stress forces exerted when filament 18 has a depth substantially equivalent to depth 26. Therefore, external stresses on filament 18 may be reduced by liquifying solder 20 when bending or flexing filament 18. Moreover, with bundles 16 configured as a helix within tube 12, each bundle 16 is positioned on the outside and inside of the bend in tube 12 for substantially equal proportions. This configuration has at least two advantages. First, this configuration averages the bending strains to substantially minimize the resultant stresses on the bundles 16. Second, and very importantly for the present invention, the helical arrangement of filaments 18 minimizes eddy currents within cable 52. With minimal eddy currents, there is less heat generated and low temperatures for more efficient current transmissions by superconductor ceramic 56 can be realized.

Figure 5:
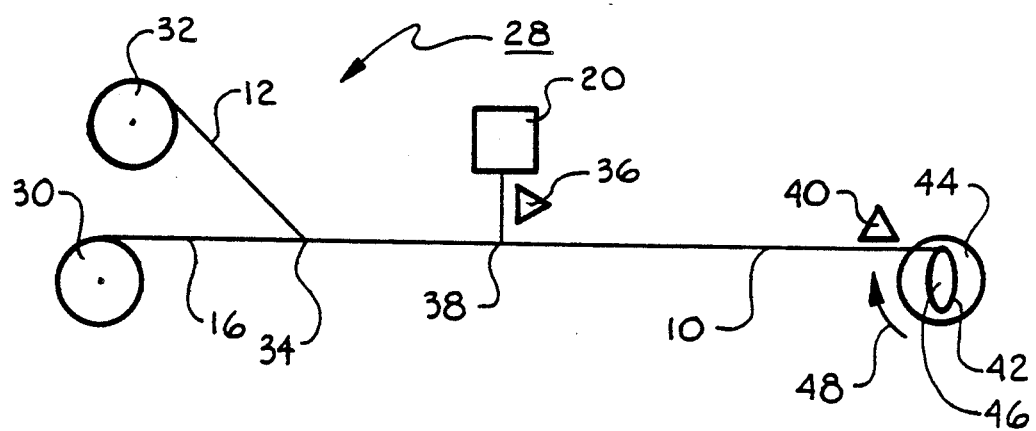
FIG. 5 is a process diagram showing the method of manufacturing a stress controlling superconductor wire.

The method of manufacturing a wire suitable for use as a winding 42 for a magnet can be readily appreciated by referring to FIG. 5. In FIG. 5, the method of manufacturing a winding for a magnet is generally designated 28. In method 28, a bundle 16 of twisted superconductor filaments 18 is disposed within the lumen 14 of tube 12. As can be appreciated, a bundle 16 of filaments 18 may be unwound from around a bundle spool 30 and tube 12 may be unwound from around tube spool 32. Once the bundles 16 are placed into tube 12 at inserter 34, it is necessary to fill lumen 14 of tube 12 with a filler material 20. As previously discussed, filler 20 is preferably a solder made of a tin-lead alloy. Filler 20 is heated and liquified by heater 36 and is then injected into lumen 14 of tube 12 at point 38 so that the lumen 14 is flooded with solder.

Wire 10 can either be put on an individual spool and allowed to harden for later use, or can be processed at winding heater 40 to reliquify filler 20 as the tube and its contents are wound upon a drum 46 to create a winding 42. The melted solder allows realignment of the superconductor fibers 18 within the solder as it is being wound. As is well known in the pertinent art, the ease with which this realignment process may be accomplished can be enhanced by a slight agitation or vibration of tube 12 and its contents during the time it is being bent into the winding 42. The subsequent solidification of the solder after the tube 12 is wound onto drum 46 provides an unstressed support for the fiber bundles 18 against magnetic forces. A rotater 44 is connected to drum 46 and is rotated in the direction of arrow 48. Winding 42 is made by continuously winding wire 10 around drum 46. Drum 46 can be of several different configurations based on the particular need.

While the particular stress controlling superconductor wire as herein shown and disclosed in detail is fully capable of obtaining the objects and providing the advantages herein before stated, it is to be understood that it is merely illustrative of the presently preferred embodiments of the invention and that no limitations are intended to the details of construction or design herein shown other than as defined in the appended claims.

We claim:

1. A superconductor wire comprising:
   a thin-walled tube extending from a first end to a second end;
   a plurality of superconductor filaments disposed within the lumen of said tube for transmitting electricity from said first end to said second end of said tube; and
   a solid filler contained in said tube and surrounding said filaments to provide support for said filaments, said filler being a solder selected from the group consisting of alloys of lead bismuth, silver, in drum or mixtures thereof and said filler being a material capable of being heated to a liquified state within said tube.

2. A superconductor wire as recited in claim 1 wherein said tube is made of copper, copper alloy, aluminum or an aluminum alloy.

3. A superconductor wire as recited in claim 1 wherein said plurality of filaments are twisted bundles of superconductor material plated onto a metallic fiber.

* * * * *